US012153799B2

(12) United States Patent
Kuo

(10) Patent No.: US 12,153,799 B2
(45) Date of Patent: Nov. 26, 2024

(54) MEMORY CONTROLLER AND METHOD FOR BIT FLIPPING OF LOW-DENSITY PARITY-CHECK CODES

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 32 days.

(21) Appl. No.: 17/933,183

(22) Filed: Sep. 19, 2022

(65) Prior Publication Data

US 2024/0061586 A1 Feb. 22, 2024

(30) Foreign Application Priority Data

Aug. 18, 2022 (TW) ................................. 111131086

(51) Int. Cl.
*G06F 3/06* (2006.01)

(52) U.S. Cl.
CPC .......... *G06F 3/0613* (2013.01); *G06F 3/0653* (2013.01); *G06F 3/0673* (2013.01)

(58) Field of Classification Search
None
See application file for complete search history.

(56) References Cited

U.S. PATENT DOCUMENTS 8,689,074 B1 * 4/2014 Tai ...................... H03M 13/658 714/24
8,689,084 B1 * 4/2014 Tai ...................... H03M 13/658 714/24

(Continued)

FOREIGN PATENT DOCUMENTS

TW I697000 B 6/2020
TW I718060 B 2/2021

OTHER PUBLICATIONS

Han, Yang, and William E. Ryan. "Low-floor decoders for LDPC codes." IEEE Transactions on Communications 57.6 (2009): 1663-1673. (Year: 2009).*

(Continued)

*Primary Examiner* — Nicholas J Simonetti

(74) *Attorney, Agent, or Firm* — McClure, Qualey & Rodack, LLP

(57) ABSTRACT

A memory controller for use in a data storage device is provided. The memory controller includes a variable-node circuit and a check-node circuit. The check-node circuit obtains a codeword difference from the variable-node circuit, and calculates a syndrome according to the codeword difference. The variable-node circuit includes a threshold-tracking circuit which is configured to track a threshold used by the variable-node circuit during a low-density parity check (LDPC) decoding process to determine whether the variable-node circuit has entered a trapping status. In response to determining that the variable-node circuit has entered the trapping status during the LDPC decoding process, the variable-node circuit switches a bit-flipping algorithm used by the variable-node circuit during the LDPC decoding process from a first flipping strategy to a post-processing flipping strategy to bring the variable-node circuit out of the trapping status. The first flipping strategy is different from the post-processing flipping strategy.

18 Claims, 8 Drawing Sheets

(56) References Cited

U.S. PATENT DOCUMENTS

| | | | | |
|---|---|---|---|---|
| 10,892,776 | B1 * | 1/2021 | Kuo | H03M 13/1108 |
| 11,108,408 | B2 | 8/2021 | Kuo | |
| 11,349,498 | B2 * | 5/2022 | Kaynak | H03M 13/1177 |
| 2009/0150745 | A1 * | 6/2009 | Langner | H03M 13/3707<br>714/752 |
| 2012/0005551 | A1 * | 1/2012 | Gunnam | H03M 13/6591<br>714/752 |
| 2014/0068368 | A1 * | 3/2014 | Zhang | H03M 13/658<br>714/752 |
| 2018/0034477 | A1 * | 2/2018 | Zamir | H03M 13/1105 |
| 2019/0312593 | A1 | 10/2019 | Hsiao et al. | |

OTHER PUBLICATIONS

Fossorier, Marc PC. "Iterative reliability-based decoding of low-density parity check codes." IEEE Journal on selected Areas in Communications 19.5 (2001): 908-917. (Year: 2001).*

Le, Khoa, et al. "A probabilistic parallel bit-flipping decoder for low-density parity-check codes." IEEE Transactions on Circuits and Systems I: Regular Papers 66.1 (2018): 403-416. (Year: 2018).*

* cited by examiner $$H = \begin{bmatrix} 1 & 1 & 0 & 1 & 0 & 1 & 0 \\ 0 & 1 & 1 & 0 & 1 & 0 & 1 \\ 1 & 1 & 1 & 1 & 0 & 1 & 0 \\ 0 & 0 & 0 & 0 & 1 & 1 & 1 \end{bmatrix}$$

Columns: V1 V2 V3 V4 V5 V6 V7; Rows: C1 C2 C3 C4

MEMORY CONTROLLER AND METHOD FOR BIT FLIPPING OF LOW-DENSITY PARITY-CHECK CODES

CROSS REFERENCE TO RELATED APPLICATIONS

This application claims priority of Taiwan Patent Application No. 111131086, file on Aug. 18, 2022, the entirety of which is incorporated by reference herein.

BACKGROUND OF THE INVENTION

Field of the Invention

The present invention relates to data access, and in particular it relates to a memory controller and a method for bit flipping of low-density parity-check (LDPC) codes.

Description of the Related Art

With the advent of semiconductor technology, low-density parity check (LDPC) codes have been implemented with very-large-scale integration (VLSI) circuits in recent years, and are widely used in the field of digital communication (e.g., including wireless communication and optical-fiber communication) and the field of data transmission (e.g., for data storage such as solid-state disks) as an error correction code (ECC).

Low-density parity check (LDPC) decoders use a linear error correcting code with parity bits. Parity bits provide a decoder with parity equations which can validate a received codeword. For example, a low-density parity check is a fixed length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n-r. The codewords can be represented by a parity check matrix, which consists of r rows (representing equations) and n columns (representing digits). The codes are called low-density because the parity matrix will have very few 1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1A is a diagram of a parity-check matrix H. FIG. 1B is a diagram of a Tanner Graph. As depicted in FIG. 1A, each row in the parity-check matrix H may form a check node, such as check nodes C1, C2, C3, and C4. Each column in the parity-check matrix H may form a variable node, such as variable nodes V1, V2, V3, V4, V5, V6, and V7.

The Tanner graph is another way to represent codewords, and can be used to explain some of the operation of the low-density parity check (LDPC) decoder on hard-decision soft decoding when using a bit-flipping algorithm.

As depicted in FIG. 1B, in the Tanner graph, check nodes represented by the square nodes C1 to C4 is the number of parity bits, and the variable nodes represent by the circular nodes V1 to V7 is the number of bits in a codeword. If a particular equation is related to a code symbol, the corresponding check node and variable node are represented by a line. The estimated information is passed along these lines and combined in different ways on the nodes.

When the LDPC decoding is started, the variable node will send an estimate to the check nodes on all lines, where these lines contain the bits that are considered correct. Then, each check node will perform a new estimate for each variable node according to all other connected estimates, and return the new estimated information to the variable node. The new estimation is based on: the parity check equation forces all variable nodes to a specific check node so that the sum is zero.

These variable nodes receive new estimation information and use a majority rule (i.e., a hard decision) to determine whether the value of the transmitted original bit is correct. If the value of the original bit is determined to be incorrect, the original bit will be flipped. The flipped bits are then returned to the check nodes, and the aforementioned steps are performed iteratively a predetermined number of times until the parity-check equation is satisfied (i.e., the value calculated by the check node matches the value received from the variable node), early termination can be enabled, which will cause the system to end the decoding process before the maximum iterative operations are reached.

The parity-check iterative operations are implemented by performing a syndrome check. A valid codeword will fit the equation $H\cdot C^T=S=0$, where H denotes a parity check matrix; C denotes a hard-decision codeword; and S denotes a syndrome. When S is equal to zero, it indicates that the decoding process is complete and no further information is needed. Generally, hard decisions and syndrome checks are performed during iterative operations. A non-zero syndrome indicates the existence of odd parity, and a new decoding iterative operation is required.

The conventional LDPC decoder using the bit-flipping algorithm may enter a trapping status during the decoding process, causing the conventional LDPC to repeatedly perform several or dozens of iterative operations in the trapping status. This will increase the error floor of the conventional LDPC decoder and reduce the decoding performance.

BRIEF SUMMARY OF THE INVENTION

Accordingly, a memory controller and a method for bit flipping of LDPC codes are provided in the invention, which can enable a variable-node circuit in a low-density parity check decoder to detect decoder trapping and make it escape from the trapping status, thereby increasing the decoding performance of the LDPC decoder.

In an exemplary embodiment, a memory controller for use in a data storage device is provided. The memory controller includes a variable-node circuit and a check-node circuit. The check-node circuit is configured to obtain a codeword difference from the variable-node circuit, and calculate a syndrome according to the codeword difference. The variable-node circuit comprises a threshold-tracking circuit which is configured to tracking a threshold used by the variable-node circuit during a low-density parity check (LDPC) decoding process to determine whether the variable-node circuit has entered a trapping status. In response to the threshold-tracking circuit determining that the variable-node circuit has entered the trapping status during the LDPC decoding process, the variable-node circuit switches a bit-flipping algorithm used by the variable-node circuit during the LDPC decoding process from a first flipping strategy to a post-processing flipping strategy to bring the variable-node circuit out of the trapping status. The first flipping strategy is different from the post-processing flipping strategy.

In some embodiments, the trapping status comprises static trapping. When the threshold-tracking circuit detects that the threshold used by the variable-node circuit has reached a predetermined number of LDPC iterative operations, the threshold-tracking circuit determines that the variable-node circuit has entered the static trapping, and sets a trapping-status signal to a high-logic state.

In some embodiments, the trapping status comprises dynamic trapping. When the threshold-tracking circuit detects that the threshold used by the variable-node circuit is periodic, the threshold-tracking circuit determines that the variable-node circuit has entered the dynamic trapping, and sets the trapping-status signal to a high-logic state.

In some embodiments, during each LDPC decoding iterative operation, the variable-node circuit executes the following steps: determining a syndrome weight according to the channel value and the syndrome from the check-node circuit; obtaining a previous codeword generated by a previous LDPC decoding iterative operation; in response to the variable-node circuit not entering the trapping status or having entered the trapping status but satisfying a predetermined condition, determining the first flipping strategy of each bit of a plurality codeword bits in the previous codeword, and flipping one or more codeword bits in the previous codeword according to the first flipping strategy to generate an updated codeword; in response to the variable-node circuit entering the trapping status but not satisfying the predetermined condition, flipping one or more codeword bits in the previous codeword according to the post-processing flipping strategy to generate the updated codeword; and subtracting the previous codeword from the updated codeword to generate the codeword difference.

In some embodiments, the variable-node circuit comprises a flipping-determination circuit and a bit-flipping circuit. The flipping-determination circuit includes a flipping-strategy lookup table and a post-processing flipping-strategy lookup table for respectively recording the first flipping strategy and the post-processing flipping strategy. The bit-flipping circuit is configured to flip one or more codeword bits in the previous codeword according to the first flipping strategy or the post-processing flipping strategy selected by the flipping-determination circuit based on the trapping-status signal to generate the updated codeword.

In some embodiments, the predetermined condition indicates that a predetermined period has elapsed after the variable-node circuit has switched to the post-processing flipping strategy. Alternatively, the predetermined condition indicates that the threshold-tracking circuit has switched the trapping-status signal from a high-logic state to a low-logic state.

In another exemplary embodiment, a method for bit flipping of low-density parity check (LDPC) codes, for use in a memory controller of a data storage device. The memory controller includes a variable-node circuit and a check-node circuit. The method includes the following steps: storing data to the flash memory of the data storage device via a storage program; obtaining a channel value read from the flash memory of the data storage device; obtaining a codeword difference, and calculating a syndrome according to the codeword difference, utilizing a threshold-tracking circuit in the memory controller to track a threshold used by the variable-node circuit during an LDPC decoding process to determine whether the variable-node circuit has entered a trapping status; and in response to determining that the variable-node circuit has entered the trapping status during the LDPC decoding process, switching a bit-flipping algorithm used by the memory controller during the LDPC decoding process from a first flipping strategy to a post-processing flipping strategy to bring the variable-node circuit out of the trapping status, wherein the first flipping strategy is different from the post-processing flipping strategy.

In some embodiments, the trapping status comprises static trapping. The method further includes the following step: when it is detected that the threshold used by the variable-node circuit has reached a predetermined number of LDPC iterative operations, determining that the variable-node circuit has entered the static trapping, and setting a trapping-status signal to a high-logic state.

In some embodiments, the trapping status comprises dynamic trapping. The method further includes the following step: when it is detected that the threshold used by the variable-node circuit is periodic, determining that the variable-node circuit has entered the dynamic trapping, and setting the trapping-status signal to a high-logic state.

In some embodiments, during each LDPC decoding iterative operation, the method further includes the following steps: determining a syndrome weight according to the channel value and the syndrome from the check-node circuit; obtaining a previous codeword generated by a previous LDPC decoding iterative operation; in response to the variable-node circuit not entering the trapping status or having entered the trapping status but satisfying a predetermined condition, determining the first flipping strategy of each bit of a plurality codeword bits in the previous codeword, and flipping one or more codeword bits in the previous codeword according to the first flipping strategy to generate an updated codeword; in response to the variable-node circuit entering the trapping status but not satisfying the predetermined condition, flipping one or more codeword bits in the previous codeword according to the post-processing flipping strategy to generate the updated codeword; and subtracting the previous codeword from the updated codeword to generate the codeword difference.

In some embodiments, the memory controller comprises a flipping-strategy lookup table and a post-processing flipping-strategy lookup table for respectively recording the first flipping strategy and the post-processing flipping strategy. The memory controller flips one or more codeword bits in the previous codeword according to the first flipping strategy or the post-processing flipping strategy selected by the memory controller based on the trapping-status signal to generate the updated codeword.

In some embodiments, the predetermined condition indicates that a predetermined period has elapsed after the variable-node circuit has switched to the post-processing flipping strategy. Alternatively, the predetermined condition indicates that the threshold-tracking circuit has switched the trapping-status signal from a high-logic state to a low-logic state.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figures 1A, 1B:
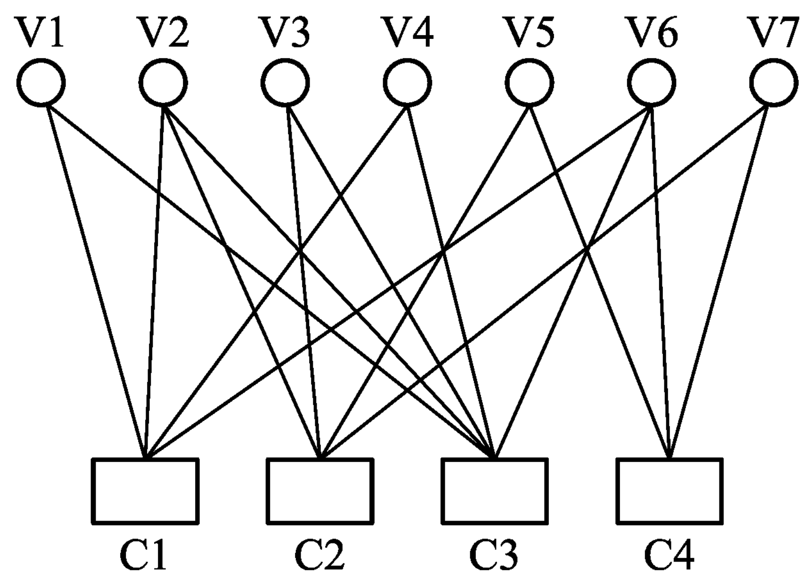
FIG. 1A is a diagram of a parity-check matrix.
FIG. 1B is a diagram of a Tanner graph.
Figure 2:
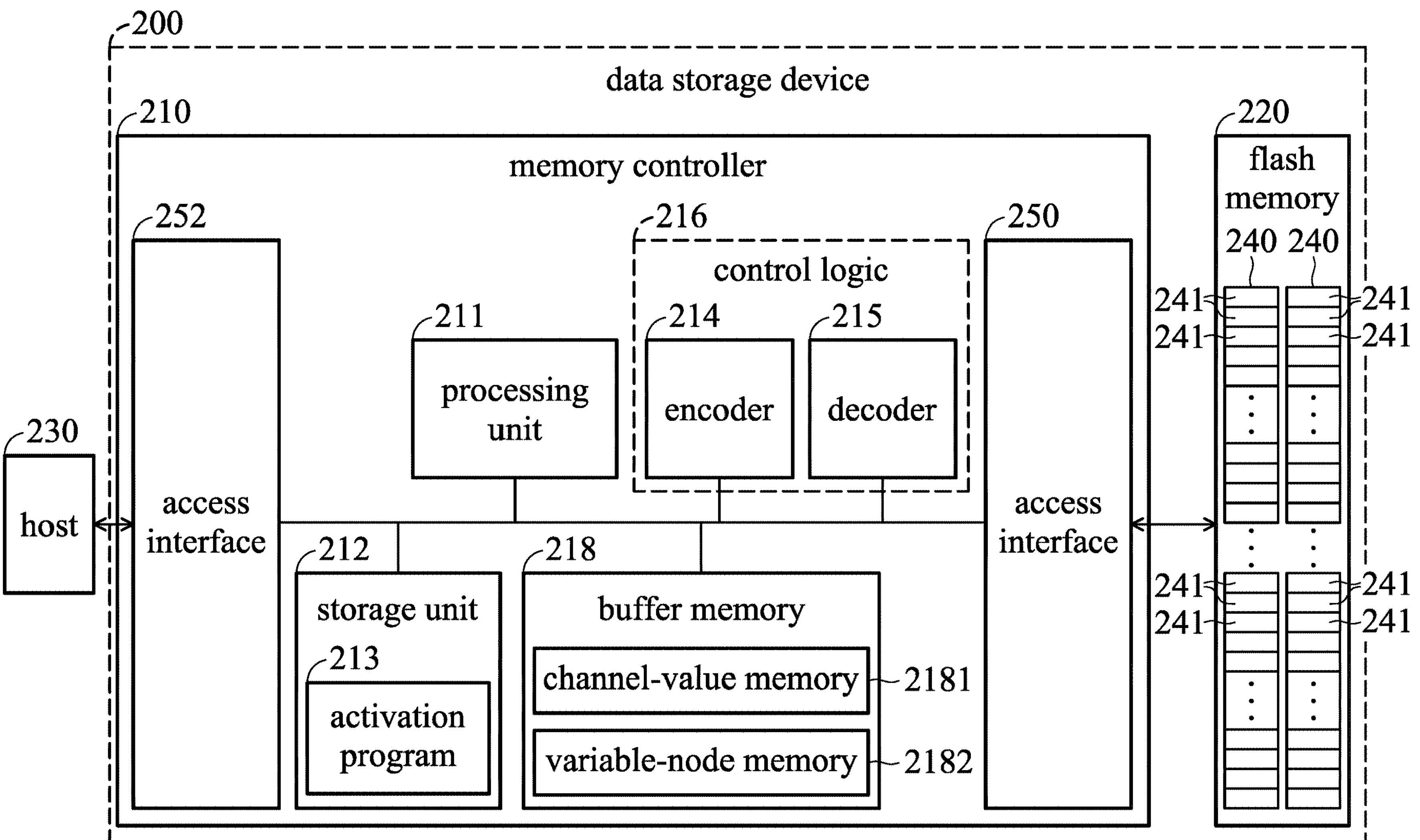
FIG. 2 is a block diagram of a data storage device in accordance with an embodiment of the invention.

FIG. 2 is a block diagram of a data storage device in accordance with an embodiment of the invention.

In an embodiment, the data storage device 200 may be a portable memory device (E.g., a memory card compatible with SD/MMC, CF, MS, XD standards) or a solid-state disk (SSD), and host 230 may be an electronic device, such as a mobile phone, a laptop computer, a desktop computer, etc., that is connected to the data storage device 200. In another embodiment, the data storage device 200 can be disposed in an electronic device such as a mobile phone, a laptop computer, or a desktop computer. At this time, the host device 230 may be a processor of the electronic device.

As depicted in FIG. 2, the data storage device 200 may include a memory controller 210 and a flash memory 220, wherein the memory controller 210 may be configured to access the flash memory 220. In an embodiment, the memory controller 210 may include a processing unit 211, a storage unit 212, a control logic 216, a buffer memory 218, and access interfaces 250 and 252. The processing unit 211 may be implemented by dedicated hardware circuits or general-purpose hardware, a processor with multiple processing cores, or a multi-processor with parallel processing capabilities, and the foregoing manner of implementation may, for example, be a general-purpose processor, or a microcontroller, but the invention is not limited thereto.

The storage unit 212 may be a non-volatile memory, such as a read-only memory (ROM), an erasable programmable read-only memory (EPROM), an electrically erasable programmable read-only memory (EEPROM), or an E-fuse. The storage unit 2121 stores an activation program that includes a boot code or a bootloader, and can be executed by the processing unit 211. The memory controller 210 completes the booting based on the activation program 213 and starts to control operations of the flash memory, such as reading an in-system programming (ISP) code.

The flash memory 220 may be a NAND flash memory, and may include a plurality of physical blocks 240, and each physical block may include a plurality of physical pages 241.

In the data storage device 200, several electrical signals are used for coordinating commands and data transfer between the processing unit 211 and the flash memory 220, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc.

The access interface 250 may communicate with the flash memory 220 using a SDR (Single Data Rate) protocol or a DDR (Double Data Rate) protocol, such as ONFI (open NAND flash interface), DDR toggle, or others. The processing unit 211 may communicate with the host 230 through an access interface 252 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

The buffer memory 218 may be a volatile memory such as a dynamic random access memory (DRAM) and/or a static random access memory (SRAM). In the embodiment, the buffer memory 218 may include a channel-value memory (CHVMem) 2181, and a variable-node memory (VNMem) 2182. The channel-value memory 2181 is configured to temporarily store the original page data (i.e., can be regarded as codewords) from the flash memory 220 via the access interface 250, or temporarily store the host commands from the host 230. The variable-node memory 2182 is configured to temporarily store the variable node data of each variable node in the decoding process for low-density parity checking. In addition, the codewords stored in the channel-value memory 2181 may be information read by the flash memory 220 in a hard or soft decision. A hard decision uses a single read voltage threshold, so the resulting codeword has only sign information. A soft decision uses multiple read voltage thresholds, so the obtained codeword also carries reliability information in addition to sign information. For example, each codeword bit can be expressed by reliability information of at least one bit. If the reliability information is expressed by a single bit, 0 and 1 can be used to indicate two different reliability levels such as strong and weak, respectively. The codeword bit used together with the reliability information can be classified into four different levels of strong "1", weak "1", weak "0", and strong "0".

The control logic 216 may include an encoder 214 and a decoder 215. In some embodiments, the encoder 214, decoder 215, and control logic 216 can be implemented by application-specific integrated circuits (ASICs), field-programmable gate arrays (FPGAs), complex programmable logic device (CPLD), or logic circuits with the same function, but the invention is not limited thereto.

Figure 3:
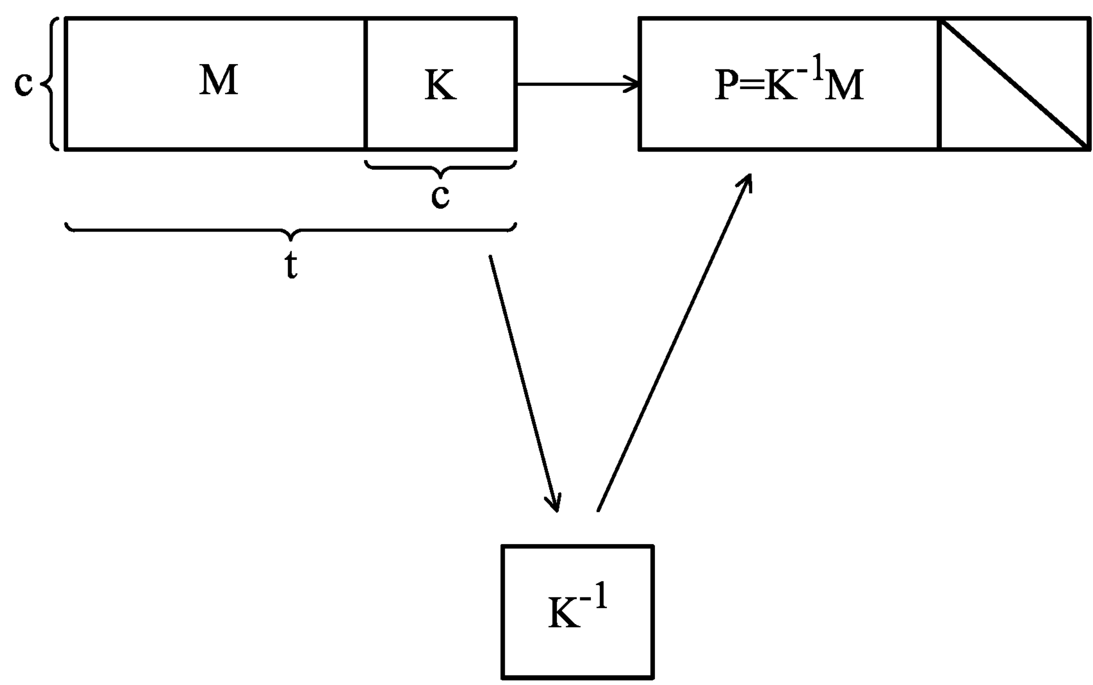
FIG. 3 is a diagram of a check-node check matrix and a check-code generation matrix.

In the embodiment, the encoder 214, for example, may be an LDPC encoder, and can generate a corresponding check code according to data from the host 230, and the generated check code conforms to a check-code check matrix. Specifically, referring to FIG. 3, it is assumed that the check-code check matrix is a matrix of size c*t (e.g., the number of rows c=5, and the number of columns t=48), and the check-code check matrix can be divided into a left-side matrix M of size c*(t-c) and a right-side matrix K of size c*c. In order to find the check-code generation matrix corresponding to the check-code check matrix, the inverse matrix $K^{-1}$ of the matrix K can be found first, and the inverse matrix $K^{-1}$ is the multiplied by the matrix M to obtain the matrix P. The transpose matrix of the matrix P can be used as the check-code generation matrix. In other words, after finding the transpose matrix of the matrix P, the encoder 214 can multiply the data from the host 230 by the transpose matrix of the matrix P to obtain the check code corresponding to the data, and then the data and the check code are multiplied by the check-code check matrix to determine whether the check code is correct. For example, if the multiplication result is equal to "0", it is determined that the encoding is correct. If the multiplication result is not equal to "0", it is determined that the encoding is incorrect. After the encoding is determined to be correct, the data and the corresponding check code will be written to one of the physical pages of the flash memory 220.

The decoder 215, for example, may be an LDPC decoder. When the host 230 sends a read command to the data storage device 200, the memory controller 210 obtains the initial page data from the flash memory 220, such as the channel value. The initial page data may include initial data and error-correction code data. Because the initial data and the error-correction code data may have errors when being transmitted through the channel, the decoder 215 may use the error-correction code data to perform error correction on the initial data and/or the error-correction code data, such as using a bit-flipping algorithm to perform LDPC decoding. The details of the decoder 215 will be described in the following embodiments.

Figure 4:
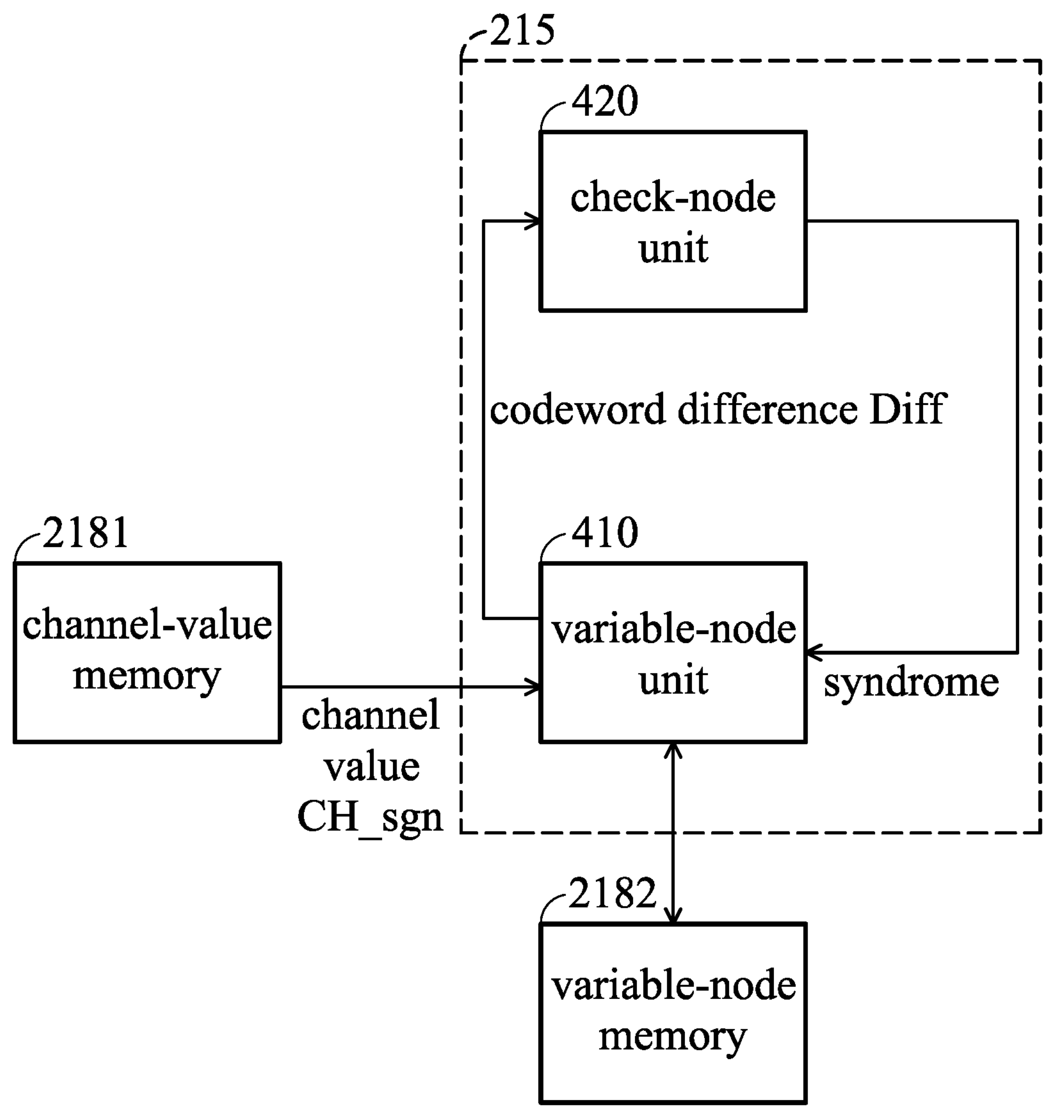
FIG. 4 is a block diagram of the decoder in accordance with an embodiment of the invention.

FIG. 4 is a block diagram of the decoder 215 in accordance with an embodiment of the invention. As depicted in FIG. 4, the decoder 215 may include a variable-node unit (VNU) 410 and a check-node unit (CNU) 420. When performing LDPC decoding, the data is iterated between the VNU 410 and CNU 420 until the correct codeword is solved or the upper limit of the number of iterative operations is reached. For example, when the decoder 215 starts decoding, the value of the previous codeword temporarily stored in the variable-node memory 2182 and the initial syndrome value are reset to 0. The VNU 410 obtains a channel value or a codeword (e.g., the previous codeword VN_prev) from the channel-value memory 2181 and performs the first iterative operation. The VNU 410 stores the bit-flipped updated codeword (VN_new) generated by the iterative operation in the variable-node memory 2182, and transmits the difference between the updated codeword and the previous codeword (VN_prev) to the CNU 420 to perform corresponding calculations on syndrome values.

If the syndrome value from the CNU 420 is not equal to 0, the VNU 410 will continue to perform the second or subsequent iterative operation. For example, the VNU 410 obtains the previous codeword VN_prev, the syndrome value, and the channel value from the variable-node memory 2182, the CNU 420, and the channel-value memory 2181, respectively, and calculates the previous codeword accordingly. If the syndrome value from the CNU 420 is equal to 0, the VNU 410 will output the updated codeword generated by the current iterative operation to output correct page data. Thus, the processing unit 211 of the memory controller 210 can report the correct page data to the host 230.

Figure 5:
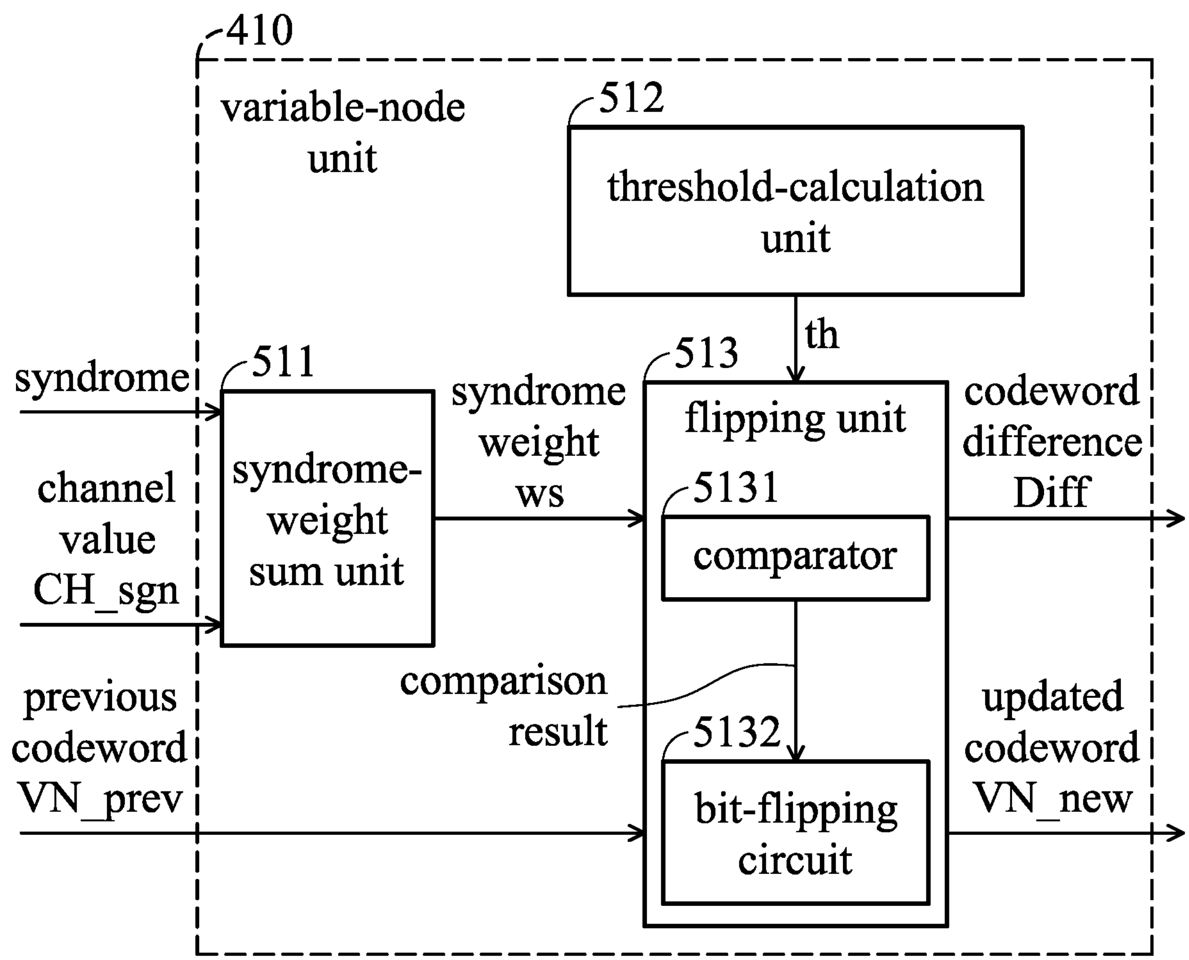
FIG. 5 is a block diagram of the variable-node unit in accordance with a first embodiment of the invention.

FIG. 5 is a block diagram of the variable-node unit in accordance with a first embodiment of the invention. Referring to FIG. 4 and FIG. 5, in the first embodiment, the VNU 410, for example, may include a syndrome-weight sum unit 511, a threshold calculation unit 512, and a flipping unit 513.

The syndrome-weight sum unit 511 is configured to generate a syndrome weight "ws" corresponding to each codeword bit according to the syndrome value "syndrome" generated from the CNU 420 and the channel value "CH_sgn" from the channel-value memory 2181.

The threshold-calculation unit 512 is configured to calculate the threshold used in the current decoding process. In the embodiment, the threshold generated by the threshold-calculation unit 512 for the decoding process may be changed according to the actual decoding situation.

The flipping unit 513 may include a comparator 5131 and a bit-flipping circuit 5132. The comparator 5131 is configured to compare the syndrome weight of each codeword bit with the threshold. The bit-flipping circuit 5132 is configured to determine whether each codeword bit should be flipped according to the corresponding comparison result, and store the bit-flipped updated codeword VN_new in the variable-node memory 2182. For example, if the syndrome weight ws of one codeword bit is greater than or equal to the threshold th, the bit-flipping circuit 5132 will flip the codeword bit, for example, from 0 to 1 or from 1 to 0. The bit-flipping circuit 5132 may calculate a codeword difference between the previous codeword and the updated codeword obtained in the current iterative operation, and transmit the codeword difference Diff to the CNU 420.

The calculation method of the codeword difference is, for example, VN_next−VN_prev. Both the updated codeword and the previous codeword are binary numbers. If the updated codeword VN_next is 0111 and the previous codeword VN_prev is 0101, the codeword difference Diff is 0010.

Figure 6:
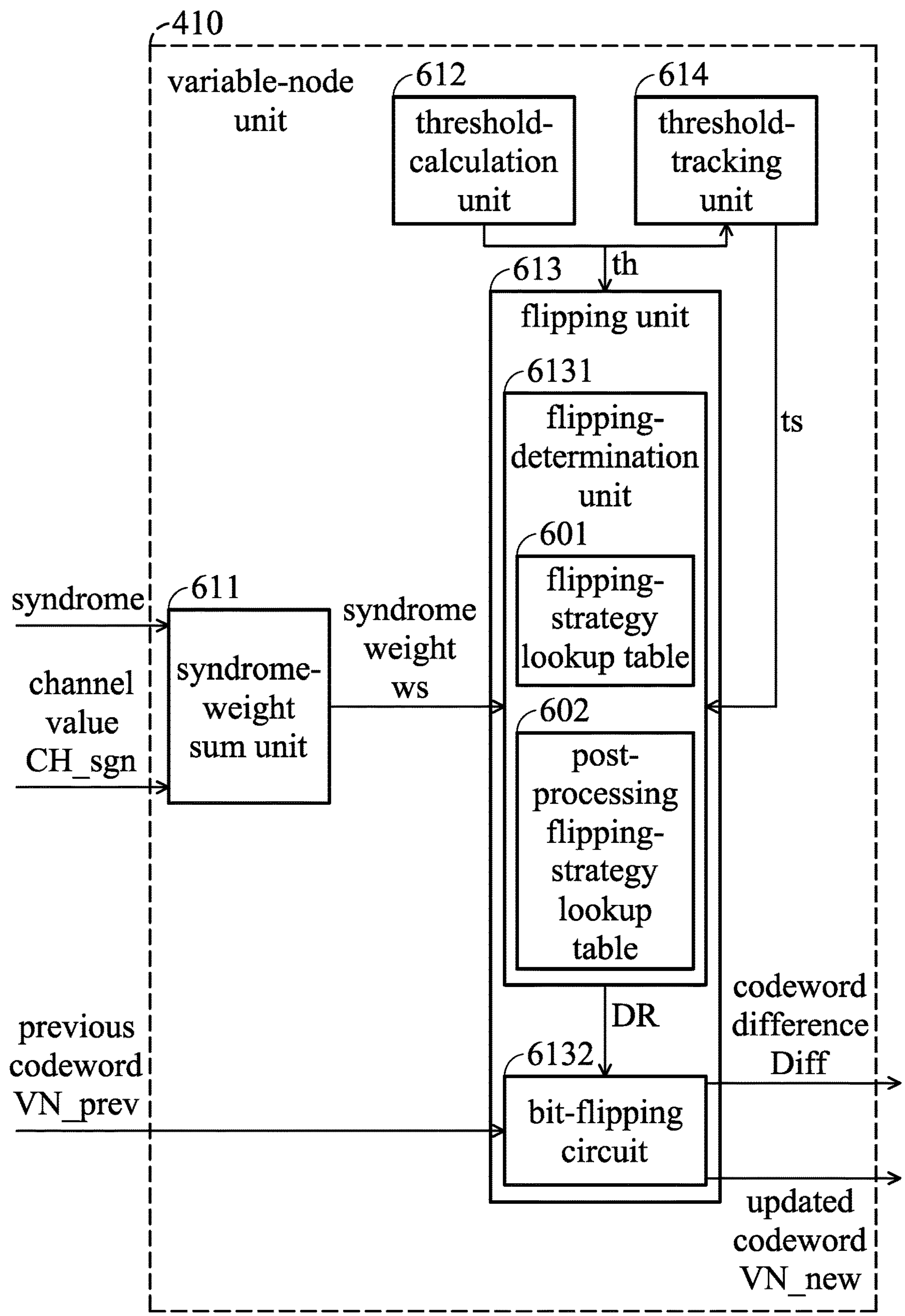
FIG. 6 is a block diagram of the variable-node unit in accordance with a second embodiment of the invention.

FIG. 6 is a block diagram of the variable-node unit in accordance with a second embodiment of the invention. Referring to both FIG. 4 and FIG. 6, in the second embodiment, the VNU 410, for example, may include a syndrome-weight sum unit 611, a threshold-calculation unit 612, a flipping unit 613, and a threshold-tracking unit 614.

The syndrome-weight sum unit 611 is configured to generate a syndrome weight "ws" corresponding to each codeword bit according to the syndrome value "syndrome" generated from the CNU 420 and the channel value "CH_sgn" from the channel-value memory 2181. The threshold-calculation unit 612 is configured to calculate a threshold used in the current decoding process, and the calculated threshold can be changed according to practical decoding conditions. For example, in some embodiments, the threshold used by the decoder 215, which performs the bit-flipping algorithm, can be the maximum number of unsatisfying bits in the codeword, where each unsatisfying bit represents each bit which does not satisfy its check equation, but the invention is not limited thereto. In some embodiments, the threshold-calculation unit 612 may update the threshold for use in the current iterative operation before starting each iterative operation in the decoding process.

The flipping unit 613 may include a flipping-determination unit 6131 and a bit-flipping circuit 6132. The flipping-determination unit 6131 is configured to determine the flipping strategy according to the syndrome weight ws and the threshold corresponding to each codeword bit. In addition, the flipping-determination unit 6131 may switch the flipping strategy according to the trapping-status signal ts generated by the threshold-tracking unit 614.

The threshold-tracking unit 614 is configured to detect variations of the threshold generated by the threshold-calculation unit 612 to detect whether the decoder 215 enters a trapping status. For example, the trapping status of the decoder 215 may include static trapping and dynamic trapping. When the current codeword processed by the decoder 215 has a trapping set, the static trapping or dynamic trapping may occur in the decoder 215, and the trapping set may cause the error floor of the LDPC to increase. For example, when the raw bit error rate (RBER) of the raw page data (or codeword) from the flash memory 220 is below a certain level, the frame error rate (FER) of the raw page data hardly decreases after the decoder 215 performs more than a certain number of LDPC iterative operations, and thus the error floor of the LDPC code is increased. At this point, part of the remaining error patterns is the trapping set.

When the decoder 215 is in the static trapping, the flipping unit 613 may repeat the same bit-flipping operations in a few bits in the codeword, and the threshold-calculation unit 612 will not detect that the status of the decoder 215 has changed at this time. The decoder 215 may remain at the same threshold until the end of the decoding process. Therefore, the threshold-tracking unit 614 can detect whether the threshold th used by the decoder 215 is a fixed threshold that is used for the predetermined number of LDPC iterative operations, thereby determining whether the decoder 215 has entered the static trapping. When the threshold-tracking 614 detects that the threshold th used by the decoder 215 is a fixed threshold which has been used for the predetermined number of LDPC iterative operations, the threshold-tracking unit 614 may determine that the decoder 215 has entered the static trapping, and set the trapping-status signal ts to a high-logic state.

When the decoder 215 is in the dynamic trapping, the flipping unit 613 may repeat the same behavior (e.g., flipping operations) with a cycle of several or dozens of iterative operations, and at this time, the threshold th generated by the threshold-calculation unit 612 will also have periodic changes. Therefore, the threshold-tracking unit 614 can detect whether the threshold th used by the decoder 215 has periodic changes, thereby determining whether the decoder 215 has entered the dynamic trapping. When the threshold-tracking unit 614 has detected that the threshold th used by the decoder 215 has periodic changes, the threshold-tracking unit 614 determines that the decoder 215 has enter the dynamic trapping, and set the trapping-status signal ts to the high-logic state.

In an embodiment, the flipping-determination unit 6131 may include a flipping-strategy lookup table 601 and a post-processing flipping-strategy lookup table 602, wherein the flipping-strategy lookup table 601 and the post-processing flipping-strategy lookup table 602 can be pre-stored in the storage unit 212. When the data storage device 200 is booted up, the processing unit 211 may load the flipping-strategy lookup table 601 and the post-processing flipping-strategy lookup table 602 into the buffer memory 218 or a register file. The flipping-strategy lookup table 601 and the post-processing flipping-strategy lookup table 602 have different flipping strategies. The flipping-determination unit 6131 may obtain the flipping strategy corresponding to the syndrome weight ws and threshold th of each codeword bit from the flipping-strategy lookup table 601. In addition, because the post-processing flipping-strategy lookup table 602 is used to get the decoder 215 out of the trapping status, the flipping strategy used by the post-processing flipping-strategy lookup table 602 can be more aggressive than the flipping-strategy lookup table 601, which means that a strong flipping strategy can be used to flip more bit steps, so that the decoder 215 does not always converge on the same trapping set or near-codeword, and has a higher chance of getting out of the trapping status.

When the threshold-tracking unit 614 determines that the decoder 215 has not entered the static trapping or dynamic trapping, the threshold-tracking unit 614 may set the trapping-status signal to a low-logic state, so the flipping unit 613 can still adopt a normal flipping strategy. When the threshold-tracking unit 614 determines that the decoder 215 has entered the static trapping or the dynamic trapping, the threshold-tracking unit 614 may set the trapping-status signal ts to the high-logic state to inform the flipping unit 613 to adopt a post-processing flipping strategy.

In the embodiment, when the trapping-status signal ts is in the low-logic state, the flipping-determination unit 6131 may adopt a normal flipping strategy. When the trapping-status signal ts is switched from the low-logic state to the high-logic state, the flipping-determination unit 6131 may switch from a normal flipping strategy to a post-processing flipping strategy. After the flipping-determination unit 6131 switches to the post-processing flipping strategy, it needs to wait for a predetermined condition to be satisfied before switching back to the original normal flipping strategy. For example, the predetermined condition may be that the predetermined period has elapsed after switching to the post-processing flipping strategy, or that the trapping-status signal generated by the threshold-tracking unit 614 has been switched to the low-logic status (that is, the threshold-tracking unit 614 has determined that the decoder 215 is not in the trapping status at this time), but the invention is not limited thereto, and those having ordinary skill in the art can set the aforementioned predetermined conditions according to actual needs.

Figure 7A:
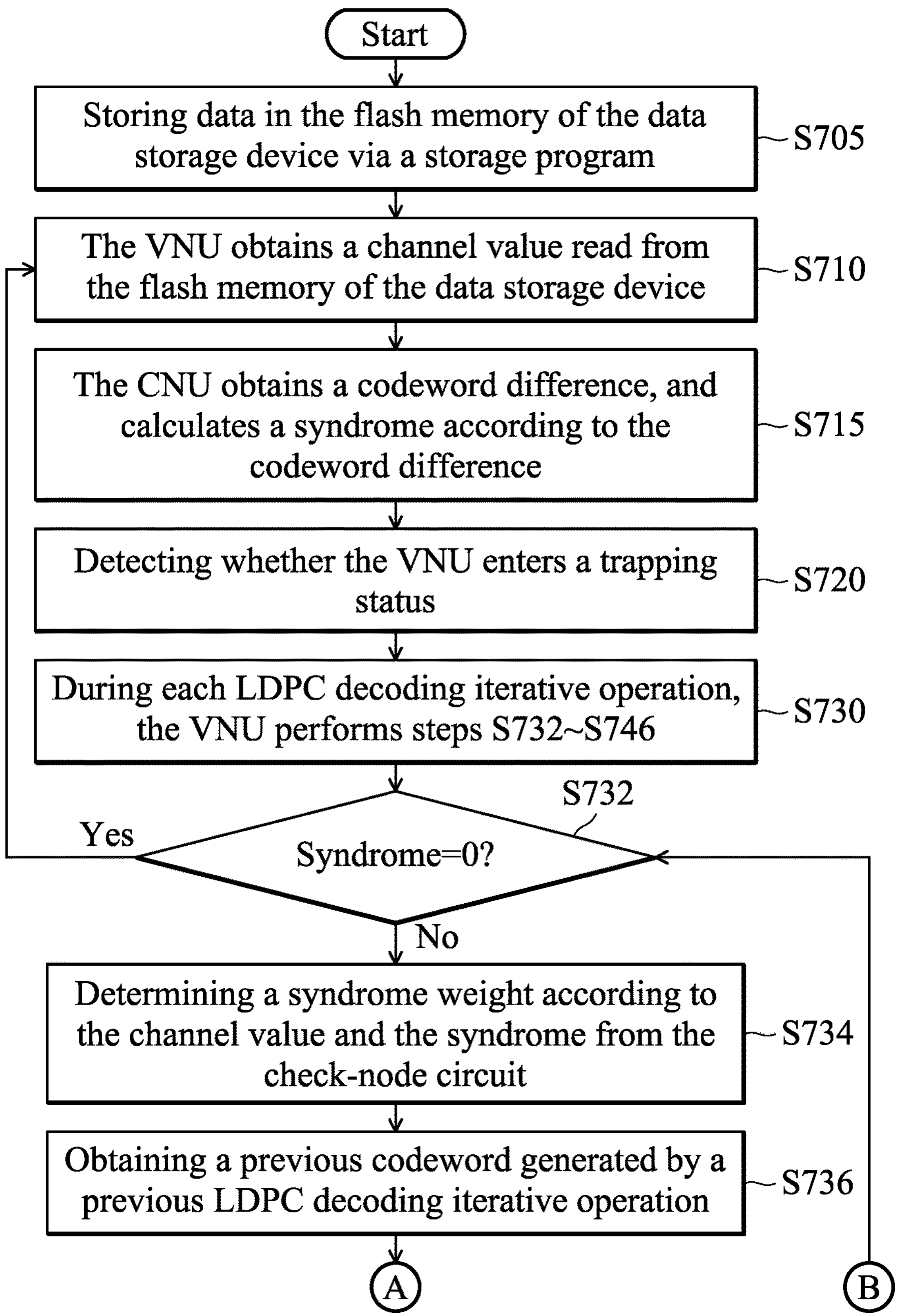
FIGS. 7A-7B are portions of a flow chart of a method for bit-flipping in LDPC codes in accordance with an embodiment of the invention.
Figure 7B:
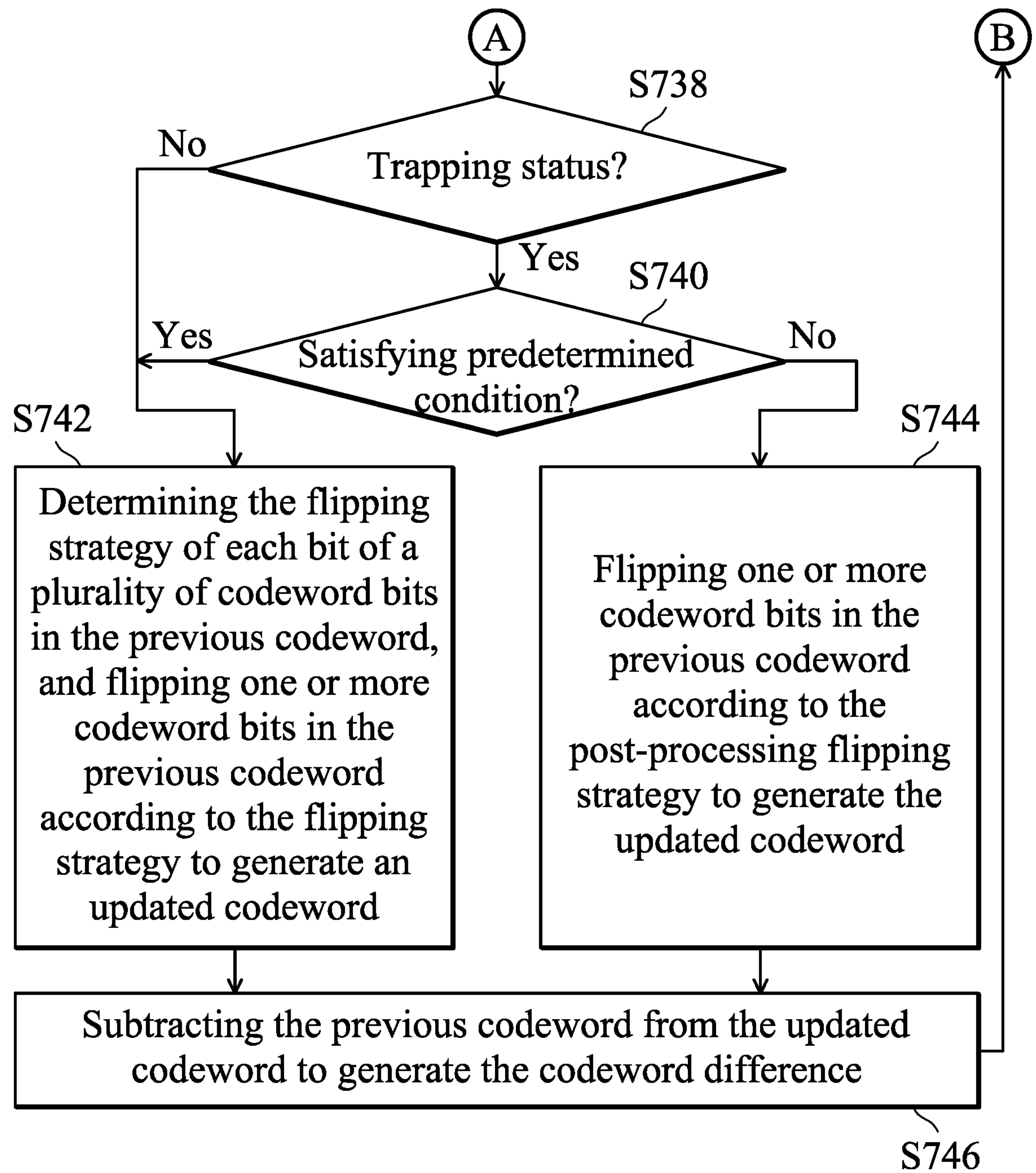

FIGS. 7A-7B are portions of a flow chart of a method for bit-flipping in LDPC codes in accordance with an embodiment of the invention. Please refer to FIG. 2, FIG. 4, FIG. 6, and FIGS. 7A-7B.

In step S705, the data is stored into the flash memory 220 of the data storage device 200 via a storage program. For example, the storage program may indicate that the data to be stored to the data storage device 200 by the host 230 is encoded by an encoding process (e.g., LDPC encoding process), and the encoded data is written to the flash memory 220.

In step S710, the VNU 410 obtains a channel value read from the flash memory 220 of the data storage device 200. For example, starting from step S710, the decoding process for the memory controller 210 to read data from the flash memory 220 is performed, and the decoding process is relative to the encoding process described above In step S715, the CNU 420 obtains a codeword difference from the VNU 410, and calculates a syndrome according to the codeword difference.

In step S720, the threshold-tracking unit 614 may detect whether the VNU 410 has entered a trapping status.

In step S730, during each LDPC decoding iterative operation, the VNU 410 performs steps S732 to S746.

In step S732, it is determined whether the syndrome generated by the CNU 420 is equal to 0. If the syndrome is equal to 0, the decoding process ends. If the syndrome is not equal to 0, step S734 is performed.

In step S734, a syndrome weight is determined according to the channel value and the syndrome from the CNU 420, wherein each codeword bit in the previous codeword has a corresponding syndrome weight.

In step S736, a previous codeword generated by a previous LDPC decoding iterative operation is obtained. For example, the updated codeword generated by the previous iterative operation is the previous codeword used in the current iterative operation.

In step S738, it is determined whether the VNU 410 is in a trapping status. When the VNU 410 is in the trapping status, step S740 is performed. When the VNU 410 is not in the trapping status, step S742 is performed.

In step S740, the flipping unit 612 determines whether the current iterative operation satisfies a predetermined condition. When the current iterative operation satisfies the predetermined condition, step S742 is performed. When the current iterative operation does not satisfy the predetermined condition, step S744 is performed. For example, the aforementioned predetermined condition may be that the predetermined period has elapsed after switching to the post-processing flipping strategy, or that the trapping-status signal is generated by the threshold-tracking unit 614 has been switched to the low-logic state (that is, the threshold-tracking unit 614 has determined that the decoder 215 is not in the trapping status at this time), but the invention is not limited thereto, and those having ordinary skill in the art can set the aforementioned predetermined conditions according to actual needs.

In step S742, a flipping strategy of a bit-flipping algorithm for each codeword bit in the previous codeword is determined according to the syndrome weight and a preset threshold, and one or more codeword bits in the previous codeword are flipped according to the flipping strategy to generate an updated codeword. For example, step S742 is performed when the decoder 215 is in a normal working mode, and the flipping unit 613 can perform LDPC decoding using the flipping-strategy lookup table 601, wherein the flipping-strategy lookup table 601 is configured to record flipping strategies corresponding to different syndrome weights and preset thresholds, wherein the flipping strategies may include strong flipping strategies, weak flipping strategies, and no-action strategies, but the invention is not limited thereto.

In step S744, an updated codeword is generated by flipping one or more codeword bits in the previous codeword according to the post-processing flipping strategy. For example, step S744 may indicate that the decoder 215 is in the trapping status (e.g., the static trapping or dynamic trapping), and the flipping unit 613 can perform LDPC decoding using the post-processing flipping-strategy lookup table 602. Because the post-processing flipping-strategy lookup table 602 is used to get the decoder 215 out of the trapping status, and thus, in comparison with the flipping-strategy lookup table 601, the flipping strategies used in the post-processing flipping-strategy lookup table 602 can be more aggressive, that is a strong flipping strategy can be used to flip more bit steps, so that the decoder 215 has a higher chance to get out of the current trapping set.

In step S746, a codeword difference is generated by subtracting the previous codeword from the updated codeword. It should be noted that during the aforementioned bit-flipping process, the reliability information of each codeword bit is considered together and the bit-flipping is performed according to the flipping strategy. However, after the bit-flipping circuit 6132 generates the codeword difference by subtracting the previous codeword from the updated codeword, the bit-flipping circuit 6132 transmits the codeword difference to the CNU 420. The bit-flipping circuit 6132 stores the reliability information corresponding to each codeword bit in the updated codeword in the variable-node memory 2182.

In view of the above, a memory controller and a method for bit flipping of LDPC codes are provided, which are capable of utilizing the variable—not unit in the LDPC decoder to detect decoder trapping and making it escape from the trapping status, thereby increasing the decoding performance of the LDPC decoder and improving the error floor of its decoding capability.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller, for use in a data storage device, the memory controller comprising:

a variable-node circuit, configured to obtain a channel value read from a flash memory of the data storage device; and a check-node circuit, configured to obtain a codeword difference from the variable-node circuit, and to calculate a syndrome according to the codeword difference, wherein the variable-node circuit comprises a threshold-tracking circuit, configured to track a threshold used by the variable-node circuit during a low-density parity check (LDPC) decoding process to determine whether the variable-node circuit has entered a trapping status, where in response to the threshold-tracking circuit determining that the variable-node circuit has entered the trapping status during the LDPC decoding process, the variable-node circuit switches a bit-flipping algorithm used by the variable-node circuit during the LDPC decoding process from a first flipping strategy to a post-processing flipping strategy to bring the variable-node circuit out of the trapping status, wherein the first flipping strategy is different from the post-processing flipping strategy, wherein the trapping status comprises static trapping, and when the threshold-tracking circuit detects that the threshold used by the variable-node circuit has reached a predetermined number of LDPC iterative operations, the threshold-tracking circuit determines that the variable-node circuit has entered the static trapping, and sets a trapping-status signal to a high-logic state.

2. The memory controller as claimed in claim 1, wherein the trapping status comprises dynamic trapping, and when the threshold-tracking circuit detects that the threshold used by the variable-node circuit is periodic, the threshold-tracking circuit determines that the variable-node circuit has entered the dynamic trapping, and sets the trapping-status signal to a high-logic state.

3. The memory controller as claimed in claim 2, wherein during each LDPC decoding iterative operation, the variable-node circuit executes the following steps:

determining a syndrome weight according to the channel value and the syndrome from the check-node circuit;

obtaining a previous codeword generated by a previous LDPC decoding iterative operation;

in response to the variable-node circuit not entering the trapping status or having entered the trapping status but satisfying a predetermined condition, determining the first flipping strategy of each bit of a plurality of codeword bits in the previous codeword, and flipping one or more codeword bits in the previous codeword according to the first flipping strategy to generate an updated codeword;

in response to the variable-node circuit entering the trapping status but not satisfying the predetermined condition, flipping one or more codeword bits in the previous codeword according to the post-processing flipping strategy to generate the updated codeword; and subtracting the previous codeword from the updated codeword to generate the codeword difference.

4. The memory controller as claimed in claim 3, wherein the variable-node circuit comprises:

a flipping-determination circuit, comprising a flipping-strategy lookup table and a post-processing flipping-strategy lookup table for respectively recording the first flipping strategy and the post-processing flipping strategy; and a bit-flipping circuit, configured to flip one or more codeword bits in the previous codeword according to the first flipping strategy or the post-processing flipping strategy selected by the flipping-determination circuit based on the trapping-status signal to generate the updated codeword.

5. The memory controller as claimed in claim 3, wherein the predetermined condition indicates that a predetermined period has elapsed after the variable-node circuit has switched to the post-processing flipping strategy.

6. The memory controller as claimed in claim 3, wherein the predetermined condition indicates that the threshold-tracking circuit has switched the trapping-status signal from a high-logic state to a low-logic state.

7. A method for bit flipping of low-density parity check (LDPC) codes, for use in a memory controller of a data storage device, wherein the memory controller comprises a variable-node circuit and a check-node circuit, the method comprising:

storing data in the flash memory of the data storage device via a storage program;

obtaining a channel value read from the flash memory of the data storage device;

obtaining a codeword difference, and calculating a syndrome according to the codeword difference, utilizing a threshold-tracking circuit in the memory controller to track a threshold used by the variable-node circuit during an LDPC decoding process to determine whether the variable-node circuit has entered a trapping status; and in response to determining that the variable-node circuit has entered the trapping status during the LDPC decoding process, switching a bit-flipping algorithm used by the memory controller during the LDPC decoding process from a first flipping strategy to a post-processing flipping strategy to bring the variable-node circuit out of the trapping status, wherein the first flipping strategy is different from the post-processing flipping strategy, wherein the trapping status comprises static trapping, and the method further comprises: when it is detected that the threshold used by the variable-node circuit has reached a predetermined number of LDPC iterative operations, determining that the variable-node circuit has entered the static trapping, and setting a trapping-status signal to a high-logic state.

8. The method as claimed in claim 7, wherein the trapping status comprises dynamic trapping, and the method further comprises:

when it is detected that the threshold used by the variable-node circuit is periodic, determining that the variable-node circuit has entered the dynamic trapping, and setting the trapping-status signal to a high-logic state.

9. The method as claimed in claim 7, further comprising:

during each LDPC decoding iterative operation, performing the following steps:

determining a syndrome weight according to the channel value and the syndrome from the check-node circuit;

obtaining a previous codeword generated by a previous LDPC decoding iterative operation;

in response to the variable-node circuit not entering the trapping status or having entered the trapping status but satisfying a predetermined condition, determining the first flipping strategy of each bit of a plurality of codeword bits in the previous codeword, and flipping one or more codeword bits in the previous codeword according to the first flipping strategy to generate an updated codeword;

in response to the variable-node circuit entering the trapping status but not satisfying the predetermined condition, flipping one or more codeword bits in the previous codeword according to the post-processing flipping strategy to generate the updated codeword; and subtracting the previous codeword from the updated codeword to generate the codeword difference.

10. The method as claimed in claim 9, wherein the memory controller comprises a flipping-strategy lookup table and a post-processing flipping-strategy lookup table for respectively recording the first flipping strategy and the post-processing flipping strategy, and the memory controller flips one or more codeword bits in the previous codeword according to the first flipping strategy or the post-processing flipping strategy selected by the memory controller based on the trapping-status signal to generate the updated codeword.

11. The method as claimed in claim 9, wherein the predetermined condition indicates that a predetermined period has elapsed after the variable-node circuit has switched to the post-processing flipping strategy.

12. The method as claimed in claim 9, wherein the predetermined condition indicates that the threshold-tracking circuit has switched the trapping-status signal from a high-logic state to a low-logic state.

13. A memory controller, for use in a data storage device, the memory controller comprising:

a variable-node circuit, configured to obtain a channel value read from a flash memory of the data storage device; and a check-node circuit, configured to obtain a codeword difference from the variable-node circuit, and to calculate a syndrome according to the codeword difference, wherein the variable-node circuit comprises a threshold-tracking circuit, configured to track a threshold used by the variable-node circuit during a low-density parity check (LDPC) decoding process to determine whether the variable-node circuit has entered a trapping status, wherein the threshold is a maximum number of unsatisfying bits in a codeword that obtains a non-zero syndrome after being calculated, where in response to the threshold-tracking circuit determining that the variable-node circuit has entered the trapping status during the LDPC decoding process, the variable-node circuit switches a bit-flipping algorithm used by the variable-node circuit during the LDPC decoding process from a first flipping strategy to a post-processing flipping strategy to bring the variable-node circuit out of the trapping status, wherein the first flipping strategy is different from the post-processing flipping strategy.

14. The memory controller as claimed in claim 13, wherein the trapping status comprises static trapping, and when the threshold-tracking circuit detects that the threshold used by the variable-node circuit has reached a predetermined number of LDPC iterative operations, the threshold-tracking circuit determines that the variable-node circuit has entered the static trapping, and sets a trapping-status signal to a high-logic state.

15. The memory controller as claimed in claim 14, wherein the trapping status comprises dynamic trapping, and when the threshold-tracking circuit detects that the threshold used by the variable-node circuit is periodic, the threshold-tracking circuit determines that the variable-node circuit has entered the dynamic trapping, and sets the trapping-status signal to a high-logic state.

16. The memory controller as claimed in claim 15, wherein during each LDPC decoding iterative operation, the variable-node circuit executes the following steps:

determining a syndrome weight according to the channel value and the syndrome from the check-node circuit;

obtaining a previous codeword generated by a previous LDPC decoding iterative operation;

in response to the variable-node circuit not entering the trapping status or having entered the trapping status but satisfying a predetermined condition, determining the first flipping strategy of each bit of a plurality of codeword bits in the previous codeword, and flipping one or more codeword bits in the previous codeword according to the first flipping strategy to generate an updated codeword;

in response to the variable-node circuit entering the trapping status but not satisfying the predetermined condition, flipping one or more codeword bits in the previous codeword according to the post-processing flipping strategy to generate the updated codeword; and subtracting the previous codeword from the updated codeword to generate the codeword difference.

17. The memory controller as claimed in claim 16, wherein the variable-node circuit comprises:

a flipping-determination circuit, comprising a flipping-strategy lookup table and a post-processing flipping-strategy lookup table for respectively recording the first flipping strategy and the post-processing flipping strategy; and a bit-flipping circuit, configured to flip one or more codeword bits in the previous codeword according to the first flipping strategy or the post-processing flipping strategy selected by the flipping-determination circuit based on the trapping-status signal to generate the updated codeword.

18. The memory controller as claimed in claim 16, wherein the predetermined condition indicates that a predetermined period has elapsed after the variable-node circuit has switched to the post-processing flipping strategy, or indicates that the threshold-tracking circuit has switched the trapping-status signal from a high-logic state to a low-logic state.

* * * * *